United States Patent [19]

Palmquist et al.

[11] Patent Number: 4,646,297
[45] Date of Patent: Feb. 24, 1987

[54] SKEW DETECTOR

[75] Inventors: Steven R. Palmquist, Beaverton, Oreg.; Kentaro Takita, Tokyo; Kazumi Hasegawa, Kanagawa, both of Japan

[73] Assignee: Tektronix, Inc., Beaverton, Oreg.

[21] Appl. No.: 594,187

[22] Filed: Mar. 28, 1984

[30] Foreign Application Priority Data

Apr. 8, 1983 [JP] Japan .................................. 58-62052

[51] Int. Cl.⁴ .......................................... H04M 3/22
[52] U.S. Cl. .......................................... 371/1; 328/55
[58] Field of Search .................... 371/1; 364/200, 900; 328/55

[56] References Cited

U.S. PATENT DOCUMENTS 4,044,329  8/1977  Besenfelder ............................ 371/1
4,520,483  5/1985  Arita ...................................... 371/1
4,556,947 12/1985  Prioste .................................. 371/1

OTHER PUBLICATIONS

Crowther, Skew Measuring Circuit, IBM Tech. Discl. Bulletin, vol. 13, No. 9, Feb. 1971.

*Primary Examiner*—Michael R. Fleming
*Attorney, Agent, or Firm*—Robert S. Hulse; Francis I. Gray

[57] ABSTRACT

A detector circuit for detecting skew or phase shift of at least three logic signals comprises an OR gate for receiving a plurality of logic signals, an exclusive-OR gate for receiving an output signal from the OR gate as well as a reference logic signal, and a pulse width check circuit responsive to the exclusive-OR gate for providing the skew detection result.

7 Claims, 9 Drawing Figures

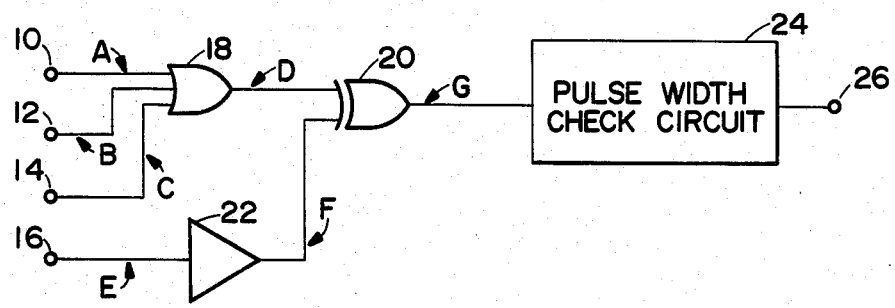
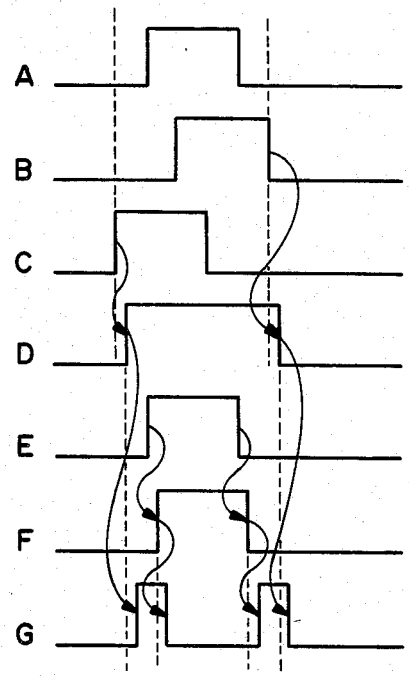
Fig. 1.
Fig. 2.
Fig. 3.
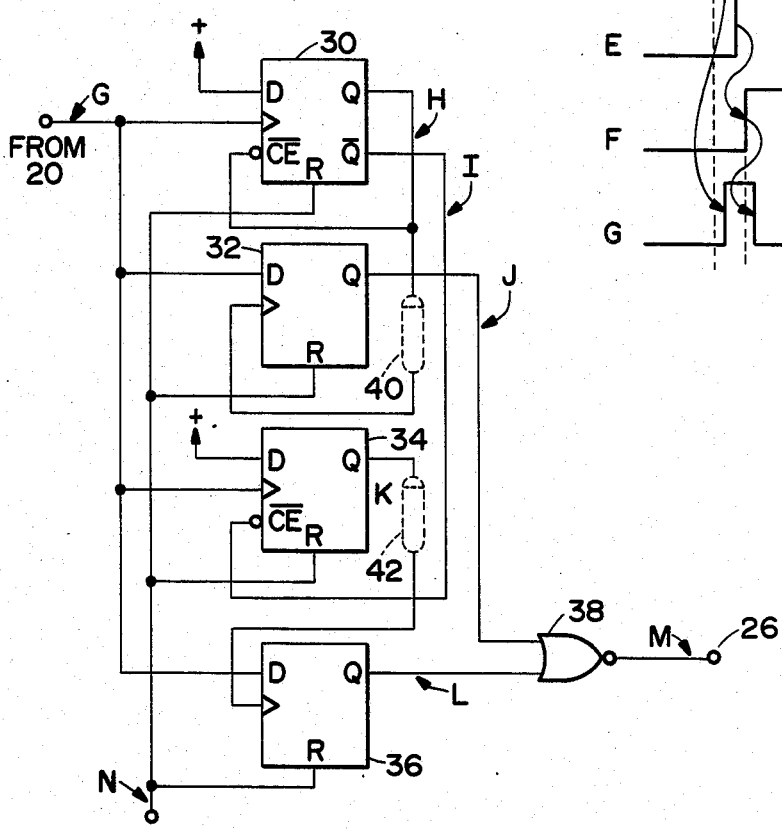

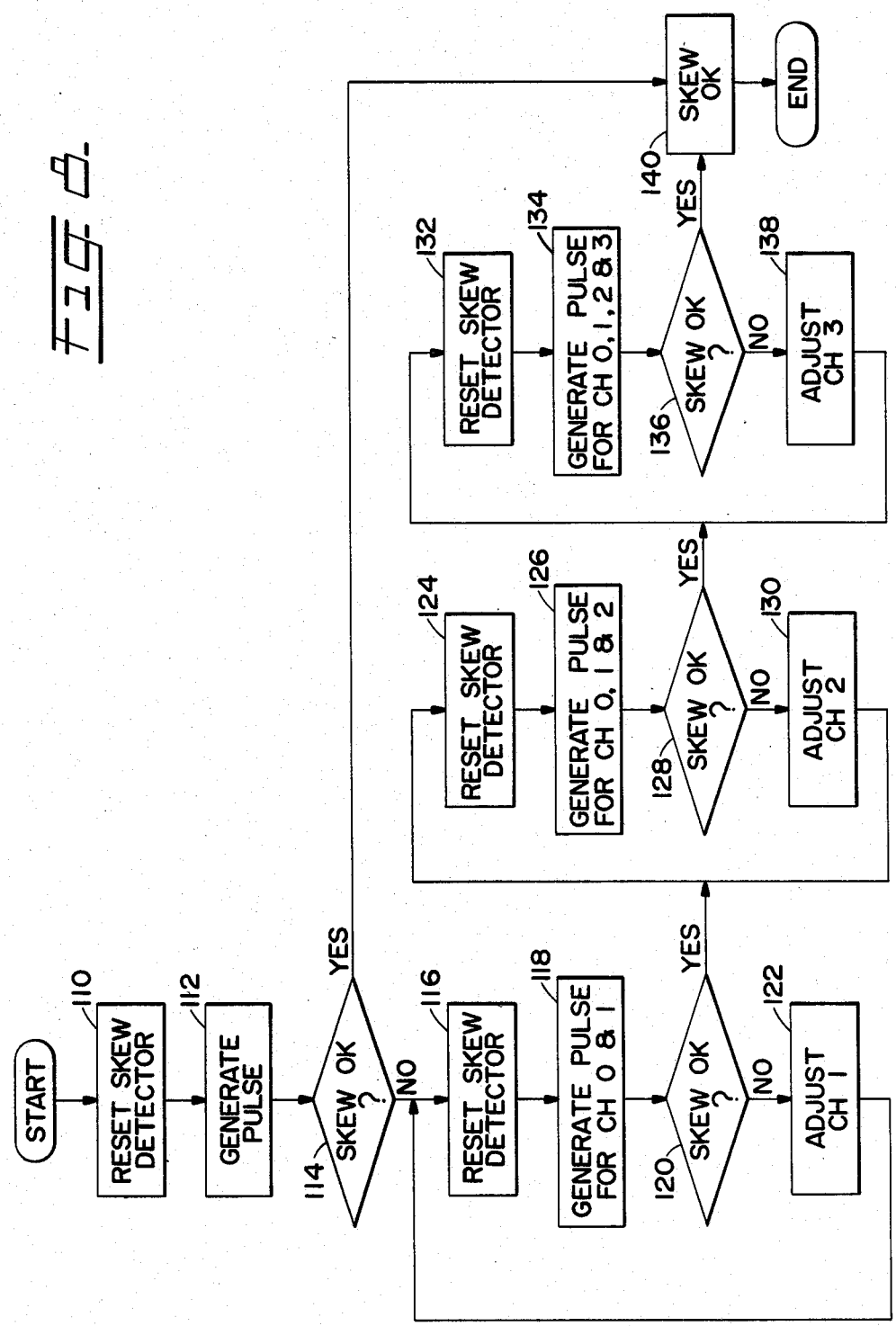

SKEW DETECTOR

BACKGROUND OF THE INVENTION

The present invention relates to a skew detector which detects skew or phase shift of at least three logic signals.

Skew is brought about by the varying propagation delay times and varying signal path lengths encountered in high speed logic circuits and is defined as the condition wherein the delay times of parallel logic signal paths are different or the phases of the output signals do not properly match although intended to be in phase. It is necessary to keep skew within predetermined limits in order to secure correct circuit operation. For example, if over a predetermined amount of skew is present in an output circuit of a logic pattern generator or in an input circuit for a logic analyzer, a correct parallel pattern cannot be generated or the parallel input logic signals cannot be properly measured. Therefore skew needs to be determined to see if it falls within predetermined limits.

A conventional skew detector compares a reference logic input signal with each of a plurality of other logic input signals, i.e., the skew detector compares the reference logic signal with a first logic signal, and further compares the reference logic signal with a second logic signal if the skew of the reference and first logic signals is within predetermined limits. After comparing all of the logic signals with the reference logic signal, the conventional skew detector outputs the detection result. Assuming that the data consists of N-bit logic signals, the conventional skew detector has to compare N−1 times (since one of the logic signals is employed as the reference logic signal). Thus, control of the comparison operation is complex and skew detection is time consuming.

It is therefore an object of the present invention to provide an improved skew detector wherein a simple detection is made as to whether skew of logic signals is within predetermined limits.

It is another object of the present invention to provide an improved skew detector which is rapid in operation.

SUMMARY OF THE INVENTION

According to the present invention, OR gate means receives a plurality of input signals, and exclusive-OR gate means receives the output signal from the OR-gate means as well as a reference logic signal which may be one of the input logic signals. A pulse width checking circuit checks the output pulse width from the exclusive-OR gate means for detecting whether or not the skew of the input and reference logic signals is within predetermined limits. If the output pulse width of the exclusive-OR gate means is narrower than a predetermined value, the skew is determined to be within limits, and it is not necessary to compare the reference logic signal with all of the input logic signals as in the prior art circuits. The OR gate means may comprise an OR gate, a wired-OR gate, a NOR gate or an AND gate having inverting input terminals and a non-inverting output terminal, while the exclusive-OR gate means may comprise an exclusive-OR gate or an exclusive-NOR gate.

The subject matter which we regard as our invention is particularly pointed out and distinctly claimed in the concluding portion of this specification. The invention, however, both as to organization and method of operation, together with further advantages and objects thereof, may best be understood by reference to the following description taken in connection with the accompanying drawings wherein like reference characters refer to like elements.

BRIEF DESCRIPTION OF THE DRAWINGS

FIG. 1 is a circuit schematic of a preferred embodiment according to the present invention, FIG. 2 is a time chart for explaining the operation of the FIG. 1 circuit, FIG. 3 is a circuit schematic of a pulse width checking circuit used with the FIG. 1 circuit, FIG. 8 is a flow chart for explaining automatic diagnostic procedures and the adjustment of skew.

DETAILED DESCRIPTION OF THE PREFERRED EMBODIMENTS

Figure 4A:
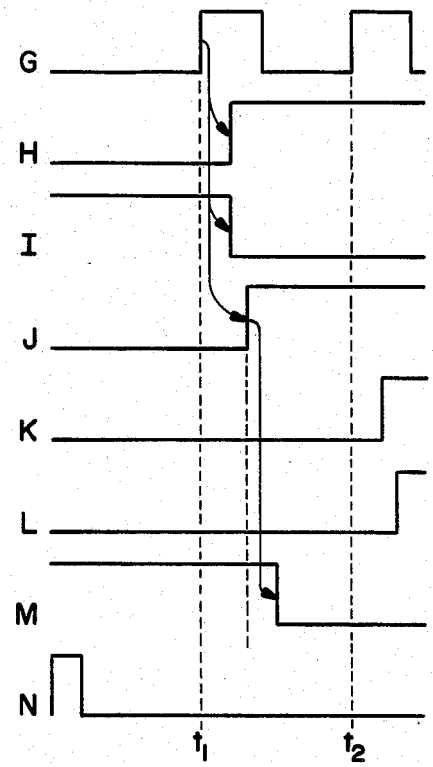
FIGS. 4A and 4B are time charts for explaining the operation of the circuit of FIG. 3.

FIG. 1 shows a circuit schematic of a preferred embodiment according to the present invention including a plurality of input terminals 10 through 16 which are connected to inputs of OR gate 18. The input logic signals to be tested and which are received on terminals 10 through 16 are usually pulses of the same width or duration. Exclusive-OR gate 20 receives the output from OR gate 18 directly as well as the logic signal at terminal 16 via buffer 22 whereby to compensate for the propagation delay time of OR gate 18. Pulse width check circuit 24 receives the output signal from exclusive-OR gate 20 and supplies the detection result at terminal 26.

The operation of this embodiment will be discussed with reference to FIG. 2. Assuming the phases of the logic signals at terminals 10 through 16 do not match, as shown in waveforms A, B, C and E of FIG. 2, OR gate 18 generates an output signal D which is "1" (high) while at least one of the signals A, B and C is "1". Thus, OR gate 18 detects the spread or scatter of the signals A, B and C. It should be noted that the FIG. 2 time chart takes into consideration the propagation delay times of devices 18, 20 and 22. As mentioned, buffer 22 compensates for the propagation delay time of OR gate 18, i.e. the signal E is delayed by the delay time equivalent to that of OR gate 18. Exclusive-OR gate 20 compares the signal D with the delayed signal F from buffer 22 and generates a signal G, in accordance with the comparison, wherein the signal G in this embodiment includes two pulses as the result of the exclusive-OR operation. The widths of the two pulses correspond to the skew of the logic signals A, B, C and E, and pulse width checking circuit 24 determines whether or not the pulse width of the signal G is within predetermined limits. If both of the pulse widths of signal G are within a predetermined value, circuit 24 generates a logic signal "1" at terminal 26 representing that the skew is acceptable, but if at least one of two pulse widths exceeds the predetermined value, a logic signal "0" is generated at terminal 26 for representing that the skew is excessive.

Referring to FIG. 3, circuit 24 is illustrated as consisting of four flip-flops 30 through 36 and a NOR gate 38. High speed flip-flops suitable for elements 30 through 36 may comprise type MC 10131, MC 1666, or MC 1670 integrated circuits. The signal G is applied to the clock terminals of flip-flops 30 and 34 and to the data terminals (D) of flip-flops 32 and 36. The data terminals of flip-flops 30 and 34 receive a logic "1" input, that is they are connected to a positive voltage. The reset terminals (R) of flip-flops 30 through 36 receive a reset signal N. The Q output terminal of flip-flop 30 is connected to the clock terminal of flip-flop 32 as well as to the clock enable terminal ($\overline{CE}$) of the same flip-flop 30, with the $\overline{Q}$ output terminal of flip-flop 30 being connected to the clock enable terminal of flip-flop 34. The Q output terminal of flip-flop 34 is connected to the clock terminal of flip-flop 36. NOR gate 38 receives the Q outputs from flip-flops 32 and 36 and provides the detection result at terminal 26.

Figure 4B:
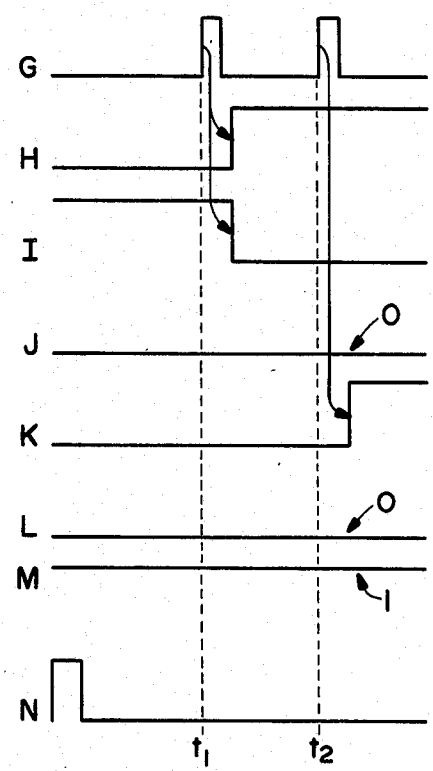

Summarizing the operation of the circuit of FIG. 3, the combination of flip-flops 30 and 32 detects whether or not the width of the first (left hand) pulse in the signal G in FIG. 2 is within predetermined limits, the combination of flip-flops 34 and 36 detects whether or not the width of the second (right hand) pulse is within predetermined limits, and NOR gate 38 combines the two detection results. FIGS. 4A and 4B comprise time charts illustrating operation of the FIG. 3 circuit. Flip-flops 30 through 36 are reset after which the logic signals A, B, C and E are applied to terminals 10 through 16 causing exclusive-OR gate 20 to generate the signal G. If there is no skew in the logic signals A, B, C, and E, the signal G is "0" (low). If the rising or the falling edges of only logic signals A, B, C and E occur substantially simultaneously, the signal G includes one pulse. In other instances of skew, the signal G includes two pulses as shown in FIG. 4.

The rising edge of the first G pulse clocks flip-flop 30 at a time t1, thereby inverting the Q output H and $\overline{Q}$ output I after the propagation delay time of flip-flop 30. The "138 level of the signal H disables flip-flop 30 so that flip-flop 30 will not respond to the second pulse of signal G. The rising edge of the signal H clocks flip-flop 32 whereby if signal G is "1" at this rising edge, the Q output J of flip-flop 32 changes from "0" to "1" as shown in FIG. 4A. When the signal G is "0" at the rising edge of the signal H, the signal J remains at the "0" level as shown in FIG. 4B. Thus, the width of the first pulse is judged by whether or not it is still high at a time determined by the propagation delay time of flip-flop 30. If it is, skew is indicated. The propagation delay time of the above-described MC 1670 IC is about 1.1 n sec. If the predetermined skew detecting value needs to be longer than the propagation delay time of flip-flop 30, delay device 40, such as a buffer or a delay line, may be inserted between the Q terminal of flip-flop 30 and the clock terminal of flip-flop 32. In such instance the predetermined skew value is the total of the propagation delay time of flip-flop 30 and the delay time of delay device 40.

Since the signal I is applied to the clock enable terminal of flip-flop 34, flip-flop 34 responds to the second pulse of the signal G. It should be noted that the "0" level period between two pulses in the signal G is longer that the propagation delay time of flip-flop 30. Flip-flop 34 transfers the "1" level at its data terminal to the Q output terminal in response to the rising edge of the signal G at a time t2, thereby changing the Q output K from "0" to "1". The rising edge of signal K clocks flip-flop 36. When the signal G is at the "1" level at the time of the rising edge of the signal K, the Q output L from flip-flop 36 changes from the "0" level to the "1" level as shown in FIG. 4A, but when the signal G is at "0" level at the rising edge of the signal K, the signal L remains at the "0" level as shown in FIG. 4B. Thus, flip-flops 34 and 36 determine whether or not the width of the second pulse in the signal G has a duration within a predetermined time value determined by the propagation delay time of flip-flop 34. The signal path between the Q output terminal of flip-flop 34 and the clock terminal of flip-flop 36 may include a delay device 42 for increasing the predetermined skew detecting value as described with respect to delay device 40.

NOR gate 38 receives the signals J and L and provides a "1" level output at terminal 26 when both of the signals J and L are at the "0" level, i.e. when both the widths of the first and second pulses in the signal G are within predetermined limits, and this "1" level at terminal 26 represents that the skew of the logic signals A, B, C and E is within predetermined limits. If the signal G includes only a first pulse and the combination of flip-flops 30 and 32 responds favorably to the signal G, an output indicating skew within predetermined limits is also produced since the signal L remains at the "0" level.

Figure 5:
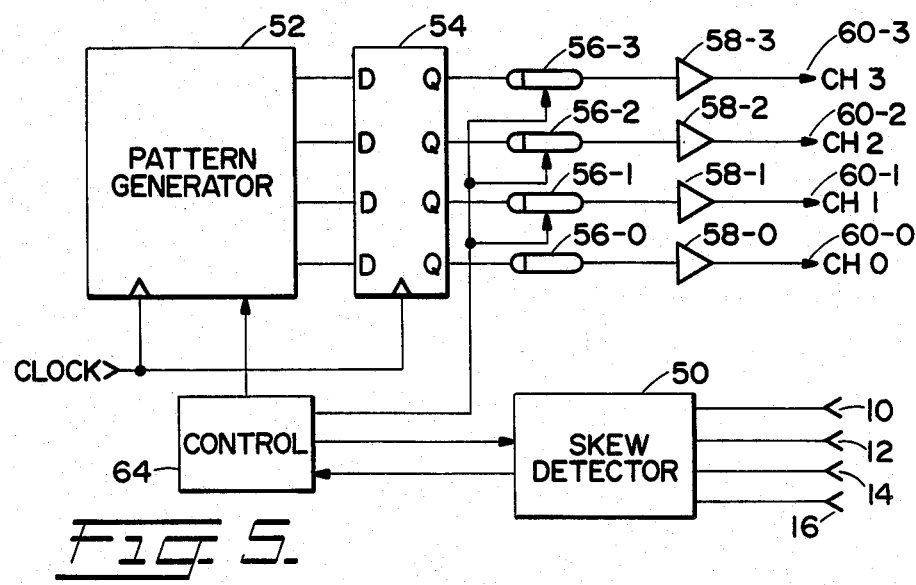
FIG. 5 is a block diagram of a logic pattern generation apparatus employing the present invention.

The skew detector of the present invention can be applied to any logic instrument. For example, FIG. 5 is a block diagram of a logic pattern generation apparatus employing a skew detector 50 according to the present invention, the pattern generator 52 applying a 4-bit pattern to probe tips 60 via latch circuit (D flip-flop) 54, delay devices 56, and buffers 58. Pattern generator 52 and latch circuit 54 receive a clock signal and latch circuit 54 improves the skew of pattern generator 52. However, the propagation delay times of each signal path (consisting of latch circuit 54, buffer 58 and the lead wire length of tip 60) may not be the same. Consequently, variable delay devices 56-1 through 56-3 are employed to adjust the delay times of channels 1, 2 and 3 to match the delay time of the channel 0 under control of control circuit 64 with the delay time of channel 0 being determined by considering the worst case. Control circuit 64 applies the reset signal to and receives the output from detector 50. For ascertaining the skew of the logic signals at probe tips 60, probe tips 60 are connected to skew detector 50 via connectors 10 through 16 (see FIG. 1), and pattern generator 52 generates a single pulse for each channel. If the detection result exceeds predetermined limits, control circuit 64 readjusts delay devices 56-1, 56-2 and 56-3.

Figure 6:
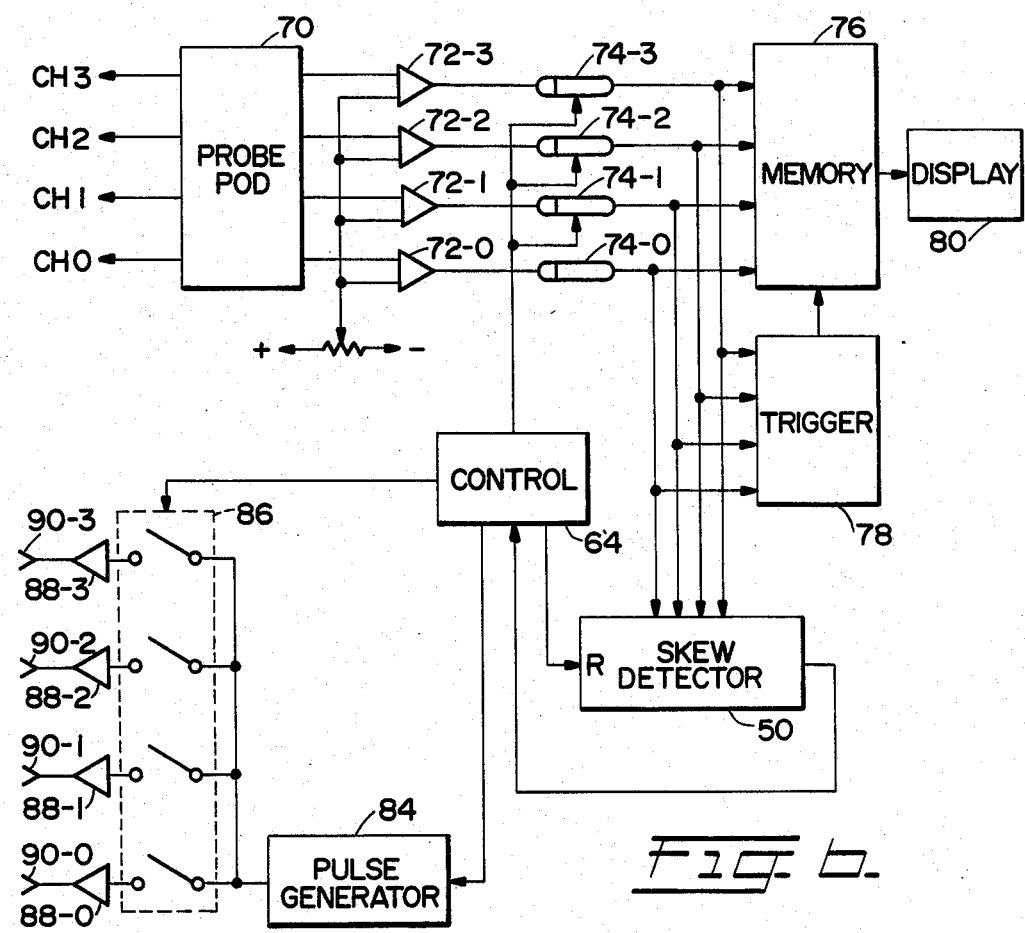
FIG. 6 is a block diagram of a logic analyzer employing the present invention.

FIG. 6 is a block diagram of a logic analyzer employing a skew detector 50 according to the present invention wherein probe pad 70 detects 4-bit data coupled to skew detector 50, memory circuit 76 and trigger circuit 78 via comparators 72 and delay devices 74. Trigger circuit 78 controls the write/read mode of memory circuit 76 and the stored data in memory circuit 76 is displayed on display device 80. Control circuit 64 controls pulse generator 84 and switches 86, and controls the delay time of delay devices 74-1 through 74-3 in response to detector 50, the latter receiving a reset signal from control circuit 64 and applying the detection result to circuit 64. Pulse generator 84 applies a single pulse to terminals 90 via switches 86 and buffers 88, and for checking the skew the probe pod 70 is connected to terminals 90 to receive the single pulse. Delay devices 74 are controlled to insure the delay times of the signal paths (consisting of probe pod 70, buffers 72 and delay devices 74) match each other, i.e., the skew of the signal paths is within predetermined limits. As in the circuit of FIG. 5, the delay time of the channel 0 is determined by considering the worst case.

Figure 7:
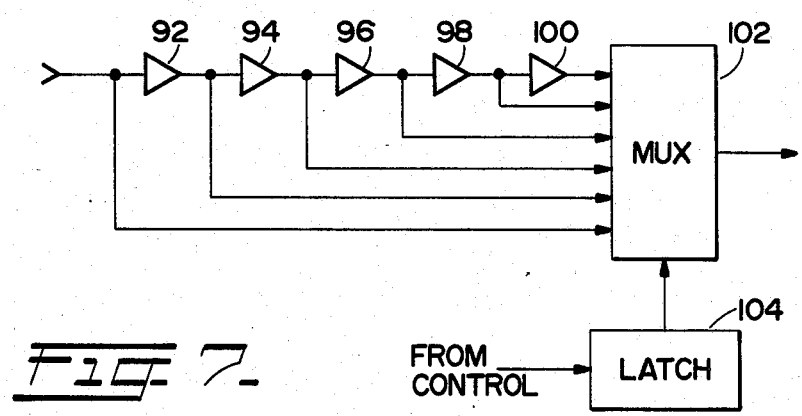
FIG. 7 is a circuit schematic of a variable delay device used in the circuits of FIGS. 5 and 6.

Variable delay devices 56-1, 56-2, 56-3, 74-1, 74-2 and 74-3 are constructed as shown in FIG. 7 wherein buffers 92, 94, 96, 98 and 100 are connected in series and multiplexer 102 selects one of the inputs of buffers 92 through 100 as well as output of buffer 100 in response to the control signal from control circuit 64 via latch circuit 104. Buffers 92 through 100 are employed as delay devices. However, delay lines may be used in the alternative.

An automatic diagnostic and adjustment procedure useful in detecting and controlling skew is shown in FIG. 8 and can be applied to the apparatus of FIGS. 5 and 6. The diagnostic and adjustment procedure is summerized as follows: First, control circuit 64 resets skew detector 50 in step 110 and controls pattern generator 52 or pulse generator 84 to generate a single pulse in step 112. Skew detector 50 then detects the skew in step 114. If the skew is outside the predetermined limit value, the skew between channels 0 and 1 is detected and adjusted by applying a pulse only to channels 0 and 1 in steps 118 through 122 and adjusting the delay in channel 1. After that, the skew of channels 0, 1 and 2 is detected and adjusted in steps 124 through 130. The skew of channels 0 through 3 is similarly detected and adjusted in steps 132 through 138. Skew detector 50 applies the "1" level to control circuit 64 for indicating that the skew is within the predetermined value in step 140.

As can be understood from the foregoing, the present invention can quickly detect whether or not the skew among several logic signals is within predetermined limits. Since the present invention compares all of the input logic signals simultaneously, the operation is simple and does not require software. Moreover, the circuit is simple in construction.

It will be obvious to those having ordinary skill in the art that many changes may be made in the above-described details of the preferred embodiments of the present invention. For example, the number of the logic signals compared may be any number, i.e. the OR gate means may receive any number of signals. If the OR gate means is a wired OR gate, it may not be necessary to compensate the propagation delay time thereof. The present invention is also applicable to skew detection in IC testers. We therefore intend the appended claims to cover all such changes as fall within the true spirit and scope of our invention.

We claim:

1. A skew detector comprising:
   OR gate means receiving a plurality of logic signals,
   exclusive-OR gate means receiving an output signal from said OR gate means and a reference logic signal,
   and means for checking the pulse width of the output signal from said exclusive-OR gate means for detecting the skew between said plurality of logic signals and said reference logic signal.

2. A detector for determining skew relative to a plurality of pulse signal inputs, comprising:
   first means for determining the signal spread of at least N−1 of said signal inputs wherein N is the number of signal inputs,
   and second means for determining when the presence of either but not both the spread and the Nth input fall within predetermined limits.

3. The detector according to claim 2 wherein said first means comprises logical OR gate means.

4. The detector according to claim 2 wherein said second means comprises logical exclusive-OR gate means and means for determining the time period output of said exclusive OR gate means.

5. The detector according to claim 4 wherein said means for determining the time period output of said exclusive-OR gate means comprises first and second flip-flops, said first flip-flop being triggered from a first state to a second state by the output of said exclusive-OR gate means, and said second flip-flop being triggered from a first state to a second state in response to the combination of outputs from said exclusive-OR gate means and said first flip-flop so that a time period is determined at least in part by the propagation time of said first flip-flop, and skew exceeding said time period results in turn-on of said second flip-flop.

6. The skew detector as recited in claim 1 wherein said reference signal comprises one of said plurality of logic signals.

7. The detector as recited in claim 5 further comprising delay means having a predetermined delay time connected between the output of said first flip-flop and the second flip-flop so that said time period is the sum of the propagation time of said first flip-flop and the predetermined delay time of said delay means.

* * * * *

UNITED STATES PATENT AND TRADEMARK OFFICE
CERTIFICATE OF CORRECTION

PATENT NO. : 4,646,297

DATED : February 24, 1987

INVENTOR(S) : Steven Palmquist, Kentaro Takita, Kazumi Hasegawa

It is certified that error appears in the above—identified patent and that said Letters Patent is hereby corrected as shown below:

Title page, item [73],

ASSIGNEE: Tektronix, Inc., Beaverton, Oreg., and Sony/Tektronix, Tokyo, Japan

Signed and Sealed this

First Day of June, 1993

Attest:

MICHAEL K. KIRK

Attesting Officer

Acting Commissioner of Patents and Trademarks